United States Patent [19]
Friesen et al.

[11] Patent Number: 5,177,381
[45] Date of Patent: Jan. 5, 1993

[54] DISTRIBUTED LOGARITHMIC AMPLIFIER AND METHOD

[75] Inventors: Michael J. Friesen, Phoenix; Warren L. Seely, Chandler, both of Ariz.

[73] Assignee: Motorola, Inc., Schaumburg, Ill.

[21] Appl. No.: 804,142

[22] Filed: Dec. 6, 1991

[51] Int. Cl.$^5$ ............................................. G06G 7/24
[52] U.S. Cl. .................................. 307/492; 328/145; 330/54; 330/277
[58] Field of Search ..................... 307/492, 303, 303.2; 328/145; 330/54, 277, 286, 295; 333/125, 127, 136

[56] References Cited

U.S. PATENT DOCUMENTS

| | | | |
|---|---|---|---|
| 4,668,920 | 5/1987 | Jones | 330/53 |
| 4,788,509 | 11/1988 | Bahl et al. | 330/54 |
| 4,853,564 | 8/1989 | Smith et al. | 307/492 |
| 4,885,483 | 12/1989 | Aitchison | 307/492 |
| 4,908,529 | 3/1990 | Aitchison | 307/492 |
| 4,973,918 | 11/1990 | Schindler | 330/54 |
| 5,025,234 | 6/1991 | De Luca | 333/166 |
| 5,060,298 | 10/1991 | Waugh et al. | 330/54 |

OTHER PUBLICATIONS

An article entitled "A Logarithmic Distributed Amplifier" by N. Nazoa-Ruiz and C. S. Aitchison, 1990 IEEE MTT-S Digest, pp. 753–756.
An article entitled "A 0.5 to 4 GHz True Logarithmic Amplifier Utilizing Monolithic GaAs MESFET Technology" by Mark A. Smith, IEEE Transactions on Microwave Theory and Techniques, vol. 36, No. 12, Dec. 1988, pp. 1986–1989.
An article entitled "High-Performance GaAs Heterojunction Bipolar Transistor Monolithic Logarithmic IF Amplifiers" by A. K. Oki, M. E. Kim, G. M. Gorman, and J. B. Camou, IEEE Transactions on Microwave Theory and Techniques, vol. 36, No. 12, Dec. 1988, pp. 1958–1965.

*Primary Examiner*—Janice A. Howell
*Assistant Examiner*—Toan Tran
*Attorney, Agent, or Firm*—Robert M. Handy

[57] ABSTRACT

A logarithmic amplifier includes amplifier stages having an input transmission line and first and second output transmission lines. The input and output transmission line are coupled by multiple amplifier elements distributed along the transmission lines. One output transmission line forms a high gain low compression path and the other a low gain high compression path. The output transmission lines of each stage are coupled to a combiner from whence the logarithmically amplified output signal is obtained. The logarithmic amplifier stages are readily constructed in MMIC form and multiple stages may be easily cascaded to provide a very large dynamic range.

17 Claims, 5 Drawing Sheets

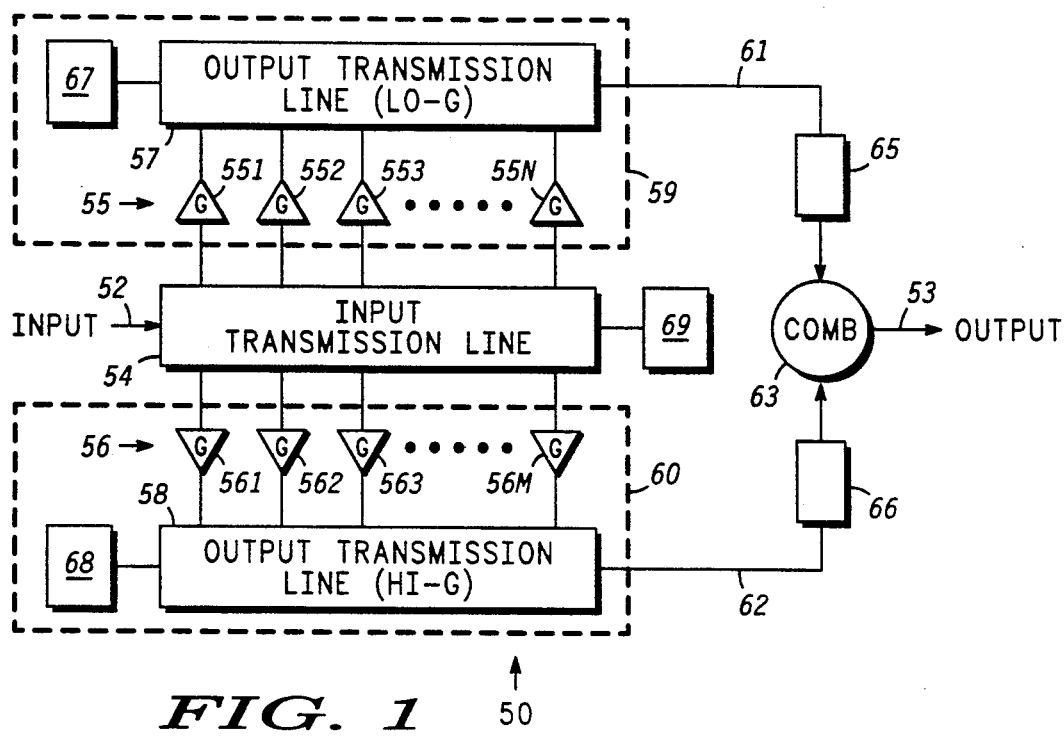
FIG. 1
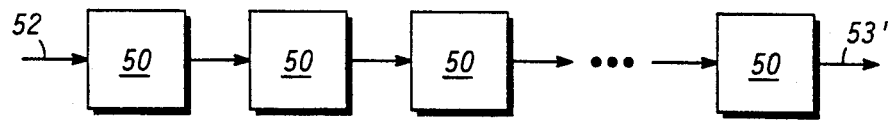
FIG. 2
FIG. 6
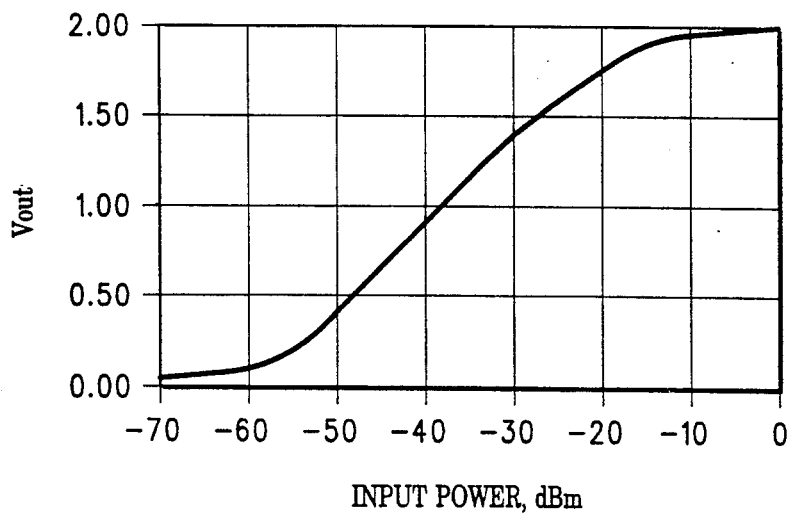

DISTRIBUTED LOGARITHMIC AMPLIFIER AND METHOD

FIELD OF THE INVENTION

The present invention concerns an improved means and method for a logarithmic amplifier and, more particularly, a distributed logarithmic amplifier suitable for use at high frequencies.

BACKGROUND OF THE INVENTION

Logarithmic amplifiers are much used in electronic systems where it is necessary to amplify signals having a very large dynamic range, for example, signals extending over several decades of amplitude. The output from such logarithmic amplifier is an amplitude compressed signal, for example, the amplifier output signal amplitude may be compressed to only one third or one fifth of the dynamic range of the amplifier input signal amplitude. The result is a significant amplification of small input signals and only minimal amplification of large input signals. For example, it may be desired to compress an input signal amplitude with 60-90 db of dynamic range to an output signal amplitude with 15-30 db of dynamic range.

Logarithmic amplifiers are known and used in present day technology and described in articles, for example, by Nazoa-Ruiz et al., entitled, "*A Logarithmic Distributed Amplifier*," 1990 IEEE MTT-S Digest, Section R-30, pages 753-756, by Smith, entitled, *A 0.5 to 4 GHz True Logarithmic Amplifier Utilizing Monolithic GaAs MESFET Technology*, IEEE Transaction on Microwave Theory and Techniques, Vol. 36, No. 12, December 1988, pages 1986-1990, and by Oki et al., entitled *High-Performance GaAs Heterojunction Bipolar Transistor Monolithic Logarithmic IF Amplifiers*, IEEE Transaction on Microwave Theory and Techniques, Vol. 36, No. 12, December 1988, pages 1958-1965. Logarithmic amplifiers are also described in U.S. Pat. Nos. 4,885,483 and 4,908,529 to Aitchison which are incorporated herein by reference.

Despite the many practical applications of logarithmic amplifiers, they suffer from a number of disadvantages well known in the art. For example, they are often physically larger or consume more power or are more expensive to construct or require numerous adjustments or are unduly sensitive to component variations than is desired, or they exhibit combinations of the above and other deficiencies well known in the art.

At high frequencies (e.g. >100 MHz), these problems become increasing difficult to avoid or overcome. For example, above about 100 MHz and especially above about 1 GHz, size, power consumption, sensitivity to device variations, difficulty of construction in Monolithic Microwave Integrated Circuit (MMIC) form, and the presence of off-chip components or the need for adjustment can severely limit their utility or performance.

Thus, a need for improved means and methods for logarithmic amplifiers continues to exist, especially logarithmic amplifiers capable of operating at high frequencies (e.g. >100 MHz).

SUMMARY OF THE INVENTION

It is a purpose of the present invention to provide an improved means and method for a logarithmic amplifier, especially a logarithmic amplifier capable of operating at high frequencies.

There is provided a logarithmic amplifier of at least one stage comprising an input transmission line for receiving an input signal and first and second output transmission lines, wherein the input transmission line is coupled to the first and second output transmission lines by multiple distributed amplifier elements, wherein the first and second output transmission lines and coupled amplifier elements form, respectively, a high gain low compression amplification path and a low gain high compression amplification path, with outputs of the respective paths coupled to first and second inputs of a combiner from whence the logarithmically amplified output signal is obtained. By extending the transmission lines, any number of amplification elements may be incorporated.

In a preferred embodiment, the input transmission line comprises multiple series connected inductive impedances having in shunt therewith at least the input capacitances of the multiple distributed amplifier elements, and the output transmission lines comprise multiple series connected inductive impedances having in shunt therewith at least the output capacitances of the multiple distributed amplifier elements. The logarithmic amplifier stage is adapted to implementation in MMIC form without adjustments or external signal components.

There is provided a method for logarithmically amplifying signals comprising, providing an input signal to an input transmission line having nodes sequentially distributed there along, coupling a portion of the input signal appearing at such sequential nodes to inputs of first and second sets of multiple amplifying elements wherein the signals are amplified and appear at outputs of the amplifying elements, coupling the signals appearing at the outputs of the first set of amplifying elements to distributed nodes of a first output transmission line and the signals appearing at the outputs of the second set of amplifying elements to distributed nodes of a second output transmission line, and combining signals appearing at outputs of the first and second output transmission lines to, respectively, first and second input ports of a combiner, wherein the combiner has an output port, and extracting the logarithmically amplified signal at the combiner output port.

Multiple stages having the above-described arrangement and method are desirably cascaded to provide greater dynamic range.

DESCRIPTION OF THE DRAWINGS

FIG. 1 is a simplified block diagram of a logarithmic amplifier stage according to the present invention;

FIG. 2 is a simplified block of a logarithmic amplifier formed by cascading multiple stages of the type shown in FIG. 1;

FIG. 6 is a graph showing the modeled response of a logarithmic amplifier stage according to the present invention.

Like reference numerals are used to identify equivalent elements in the various figures.

DETAILED DESCRIPTION OF THE DRAWINGS

Figure 3:
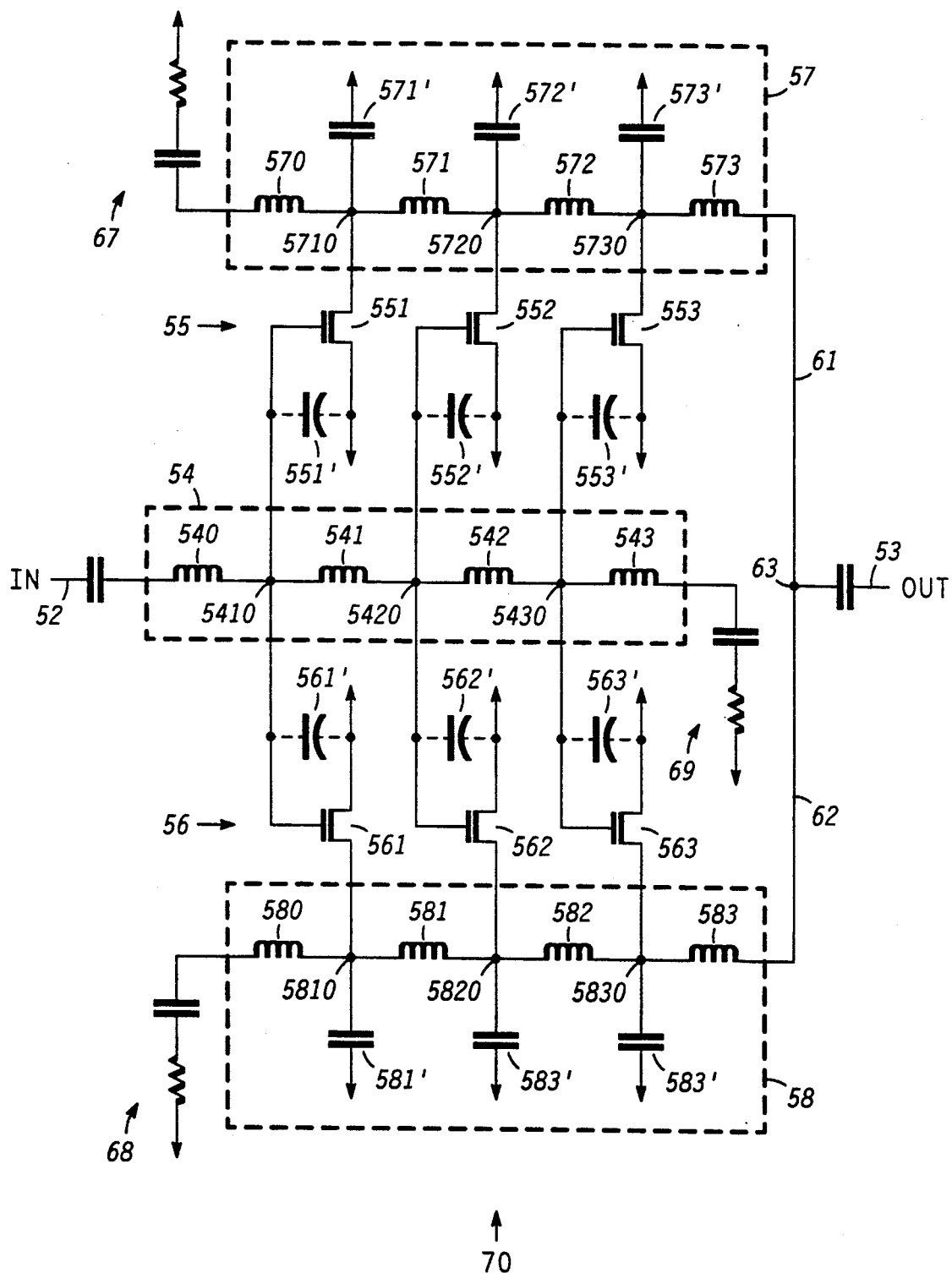
FIG. 3 is a simplified schematic circuit diagram of a logarithmic amplifier stage according to a preferred embodiment of the present invention.

FIG. 1 is a simplified block diagram of logarithmic amplifier stage 50 according to the present invention. Amplifier stage 50 has input 52 and output 53. Input 52 is coupled to input transmission line 54. Sets 55, 56 of multiple amplifying elements 551, 552, 553, . . . , 55N and 561, 562, 563, . . . , 56M, respectively, have their inputs coupled to input transmission line 54 at various nodes distributed along transmission line 54. M and N are integers.

Amplifying element set 55 and transmission line 57 form low gain high compression path 59 having output 61 from transmission line 57, and amplifying element set 56 and transmission line 58 form high gain low compression path 60 having output 62 from transmission line 58. Either of paths 59, 60 may be the low gain high compression path with the other being the high gain low compression path. For convenience of explanation, path 59 is henceforth identified as the low gain high compression path and path 60 as the high gain low compression path. The labels "high gain low compression" or "low gain high compression" are intended to be descriptive of the relative amount of gain and amplitude compression provided along the particular path. Outputs 61, 62 are coupled to combiner 63, which is conveniently an adding or summing element or node, wherein the combined signals form logarithmically amplified output 53.

Matching elements 65, 66 may be optionally provided, respectively, between outputs 61, 62 and combiner 63 to improve coupling thereto. Also, transmission line terminations 67, 68, 69 are typically included with transmission lines 57, 58, 54 respectively, to reduce reflections in the transmission lines. Those of skill in the art will understand how to choose the impedance of such matching elements and terminations to improve coupling and reduce reflections based on principles well known in the art.

The figures that follow illustrate the present invention in terms of distributed amplifiers stages having a particular number of amplifying elements, generally three amplifying elements in each of two paths, but this is merely for convenience of explanation. Those of skill in the art will understand based on the description herein that any number of amplifying elements can be used. Hence, the three amplifying elements per path illustrated in these figures is merely intended to be exemplary and not limiting. Further, the amplifier stages illustrated in these figures are cascadable to form logarithmic amplifiers having greater dynamic range.

FIG. 2 shows a simplified block of logarithmic amplifier 51 formed by cascading multiple stages 50 of the type shown, for example, in FIGS. 1 and 3-5. An advantage of amplifier stage 50 is that it may be readily cascaded without difficulty to form amplifier 51 having wider dynamic range, each stage 50 (or stages 70, 80 of FIGS. 3-4) being substantially identical in structure.

FIG. 3 shows a simplified schematic circuit diagram of logarithmic amplifier stage 70 analogous to stage 50 of FIGS. 1-2, but with more detail. The elements comprising transmission lines 54, 57, 58, amplifier sets 55, 56 and terminations 67-69 of FIG. 1 are indicated in FIG. 3. The circuit of FIG. 3 has six transistors arranged three in the high gain low compression path and three in the low gain high compression path, but this is not essential. Other combinations of amplifying elements can also be used.

Transmission line 54 comprises inductors 540-543 and capacitors 551'-553', 561'-563'. In this particular implementation using MESFETs as multiple amplifiers 55, 56, the input capacitances of multiple MESFETs 551-553, 561-563 conveniently provide transmission lines capacitances 551'-553', 561'-563'. But, this is not essential and other capacitance can be used, as for example, separate lumped or distributed capacitances. Also, while MESFETs are particularly convenient and preferred other amplifying elements can also be used. Bipolar transistors and MOSFETs are non-limiting examples of other suitable amplifying elements. As used herein, the word "transistor", singular or plural, is intended to include all types of solid state or hybrid amplifying elements.

Transmission line 57 comprises inductances 570-573 formed in any manner desired, and capacitances 571'-573' formed by the parasitic output capacitance of amplifying elements 551-553 or separate capacitances formed in any manner desired or a combination thereof. Transmission line 58 comprises inductances 580-583 formed in any manner desired, and capacitances 581'-583' formed by the parasitic output capacitance of amplifying elements 561-563 or separate capacitances formed in any manner desired or a combination thereof.

Multiple amplifying elements 551-553 and 561-563 are distributed along transmission line 54, having their inputs coupled to sequentially arranged nodes 5410-5430 of input transmission line 54. Multiple amplifying elements 551-553 have their outputs coupled to sequentially arranged nodes 5710-5730 of output transmission line 57, and multiple amplifying elements 561-563 have their outputs coupled to sequentially arranged nodes 5810-5830 of output transmission line 58. While the circuit of FIG. 3 illustrates a distributed amplifier employing amplifying elements 551-553 and 561-563, those of skill in the art will understand based on the explanation herein that a smaller or larger number of elements 551, . . . , 55N and 561, . . . , 56M may be used, where N and M are integers. In the preferred embodiment, N and M are equal but this is not essential.

Multiple amplifying elements 551-553 and 561-563 are shown as having their inputs coupled to the same nodes 5410-5430 of input line 54, but this is not essential and the inputs of amplifying elements 551-553 of amplifier set 55 may be connected to different nodes than the inputs of amplifying elements 561-563 of amplifier set 56. For example, and not intended to be limiting, the nodes of input line 54 at which the inputs to amplifiers 551, 561 connect can be different and have intervening impedances there between, and similarly for one or more of amplifiers 552, 562, . . . , and 55N, 56M, but this is not essential.

While amplifiers 55, 56 are shown as being MESFETs, those of skill in the art will understand based on the explanation herein that other types of amplifying elements may also be used. Further, while either enhancement or depletion mode FETS may be used for amplifiers 55 or 56 or both, better performance is obtained by using enhancement mode FETS in high gain low compression path 60 and depletion mode FETS in low gain high compression path 59.

Figure 4:
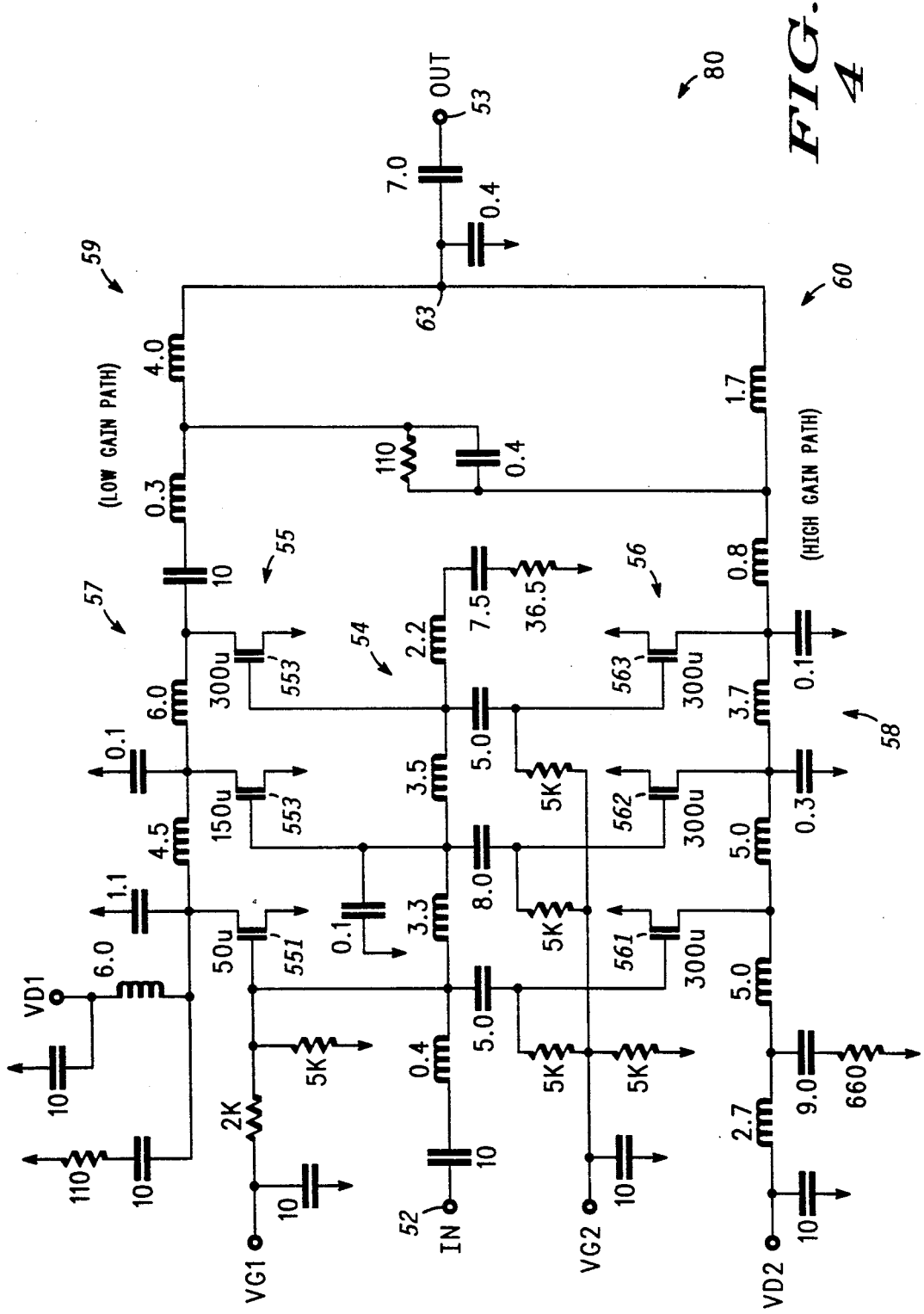
FIG. 4 is a simplified schematic circuit diagram of a logarithmic amplifier stage according to a preferred embodiment of the present invention, showing additional detail.

FIG. 4 is a simplified schematic circuit diagram of logarithmic amplifier stage 80 analogous to stages 50, 70 shown in FIGS. 1-3 but in further detail and according to a preferred embodiment of the present invention and using depletion mode MESFETs for multiple amplifier elements 55, 56. The same reference numerals are used in FIG. 4 as in FIGS. 1 and 3 to identify analogous elements or combinations of elements, i.e., input 52, output 53, input transmission line 54, multiple amplifier elements 55, 56, output transmission lines 57, 58 and combiner 63.

Typical component values are indicated on FIG. 4 for an amplifier stage suitable for operation in the 1-5 GHz frequency range. The channel widths in microns of the various MESFET amplifying elements in amplifier element 55, 56 are also shown. Amplifier elements 551, 552, 553 of low gain high compression path 59 have channel widths that increase along the transmission lines from input to output. For example, MESFET 551 has a channel width of 50 microns, element 552 has a channel width of 150 microns and element 553 has a channel width of 300 microns. Conversely, amplifying elements 561, 562, 563 of high gain low compression path 60 have substantially constant channel widths, in this example, about 300 microns.

The transconductance of the MESFETs varies approximately directly with the channel width, the larger the channel width the higher the transconductance and the smaller the channel width, the smaller the transconductance. Thus, another way of viewing the teaching of FIG. 4 is that, in low gain path 59, the transconductance of some or all of amplifying element 551-55N increase as one proceeds from amplifier to amplifier along input transmission line 54 (or output transmission lines 57, 58) away from input 52 while the transconductance of amplifying elements 561-56M in high gain path 60 remains substantially constant. In the preferred embodiment, the transconductances of the successive amplifying elements of the low gain path increase monotonically, but this is not essential. It is preferred that they not decrease.

In the preferred embodiment, the low gain high compression path should have as close to 1:1 voltage amplitude gain as is practical (i.e., 0 db gain). The high gain path may have any desired gain depending on the transistor technology available and the design objectives. The high gain path sets the slope of the transfer curve, i.e., the slope of FIG. 6.

High gain low compression path 60 is generally biased differently than low gain high compression path 59 in order to achieve the foregoing properties. For example, transistors of the high gain low compression path are typically biased closer to the origin of their output I-V characteristics while transistors of the low gain high compression path are typically biased about in the center of the I-V curves to allow maximum swing before saturation or clipping.

Figure 5:
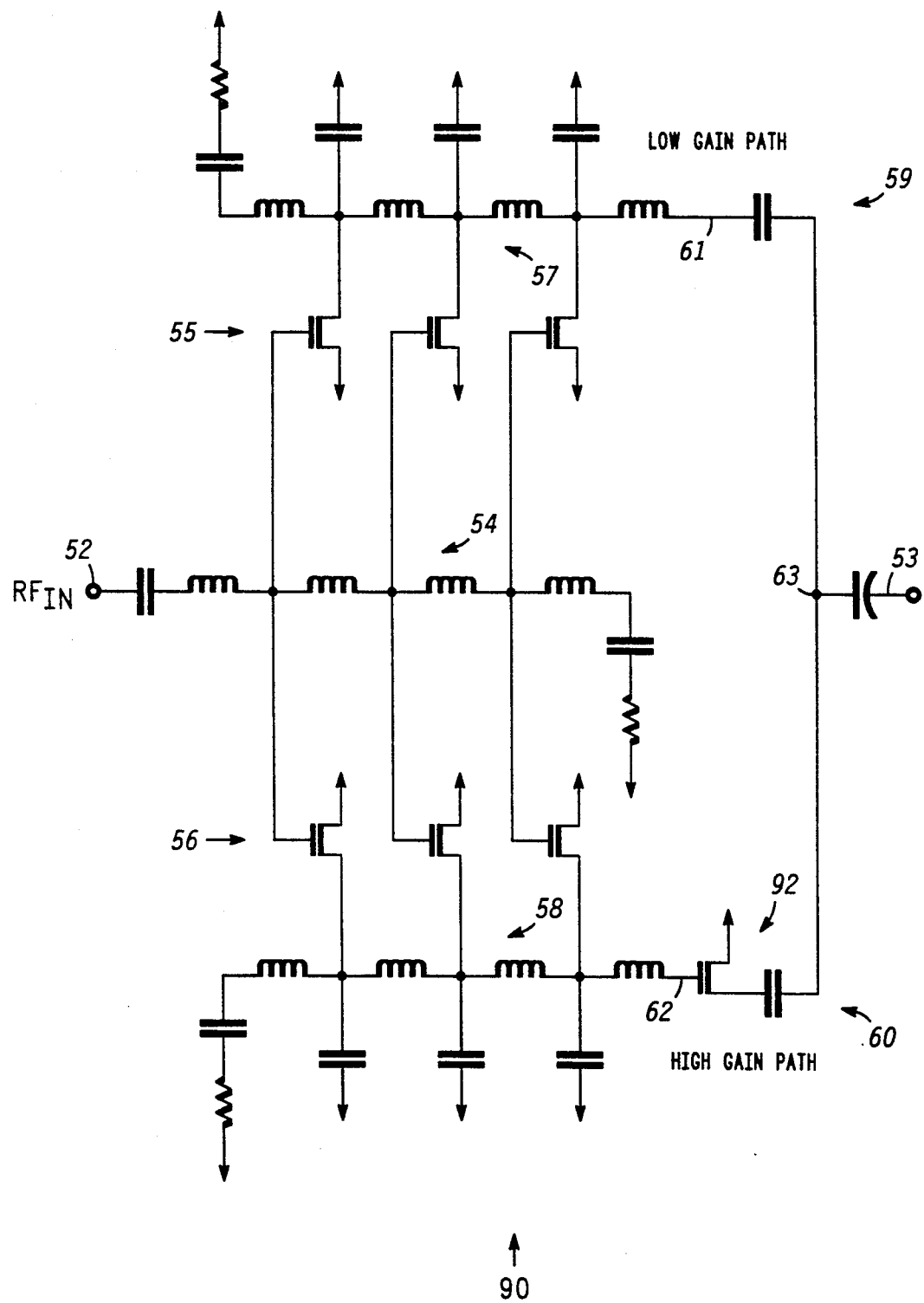
FIG. 5 is a simplified schematic circuit diagram of a logarithmic amplifier stage according to a further embodiment of the present invention.

FIG. 5 is a simplified schematic circuit diagram of logarithmic amplifier stage 90 according to a further embodiment of the present invention. Amplifier stage 90 is substantially the same as amplifiers 50, 70, 80 of FIGS. 1-4 except that additional amplifying element 92 is coupled in series in high gain low compression path 60 between output 62 of transmission line 58 and combiner 63. Amplifying element 92 is conveniently a small MESFET or other transistor of the same type used for the elements of amplifier sets 55, 56 in order to simplify fabrication. Amplifying elements 92 has the effect of lowering the compression point, that is, the point at which the amplified signal begins to clip, limiting further gain.

FIG. 6 is a graph showing the modelled response of single logarithmic amplifier stage 70, 80 of the type described in FIGS. 3-4, operating at about 1-4 GHz, according to the present invention. The abscissa is the log of the input power in dbm ranging from −70 to 0 dbm and the ordinate is the output signal voltage ranging from approximately 0 to about 2 volts. About 11 db of signal compression is achieved in the single amplifier stage and the stage exhibits a significant range over which the output voltage versus log input power plot is substantially linear. In this range, true logarithmic amplification is provided.

Measurements made on actual amplifiers stages constructed in MMIC form using GaAs substrates and GaAs MESFETs gave performance substantially equivalent to the characteristic shown in FIG. 6. Other semiconductor materials may also be used. The amplifier stage performance was evaluated over a frequency range of from about 1-5 GHz wherein it operated satisfactorily, but providing better performance, i.e., flatter gain vs frequency response and relative insensitivity to fabrication process parameter variation over the narrower range of about 1.5-4.5 GHz.

The method of the present invention is as follows. The letters N and M are used in describing the method to represent an integer number of elements or nodes or the like, as for example, N or M = 2, 3, 4, ..., 10, 11, 12, ..., etc., in connection with various reference numerals of the figures. This is intended to indicate that the number of stages or nodes or elements is determined by the user and may be larger or smaller than the specific examples given herein.

An input signal 52 is provided to an input transmission line 54 having nodes (e.g., nodes 5410-54NO) sequentially distributed along transmission line 54. The input signals appearing at the sequential nodes (e.g., nodes 5410-54NO) of input transmission line 54 are coupled to inputs of first and second sets 55, 56 of multiple amplifying elements 551-55N, 561-56M connected to the various sequential nodes (e.g., 5410-54NO) of input transmission line 54. Each distributed input is amplified according to the transconductance of the individual amplifying elements 551-55N, 561-56M and appears at output thereof. The amplified signals of the first set of distributed amplifying elements 551-55N are coupled to distributed nodes 5710-57NO of the first output transmission line 57. The amplified signals appearing at outputs of the second set of amplifying elements 561-56M are coupled to distributed nodes 5810-58NO of the second output transmission line 58. The signals output from transmission lines 57, 58 are coupled to first and second input ports of combiner 63. The combiner provides logarithmically amplified output 53 formed from the combination or sum of outputs 61, 62 of transmission lines 57, 58.

EXAMPLE

Figure 7:
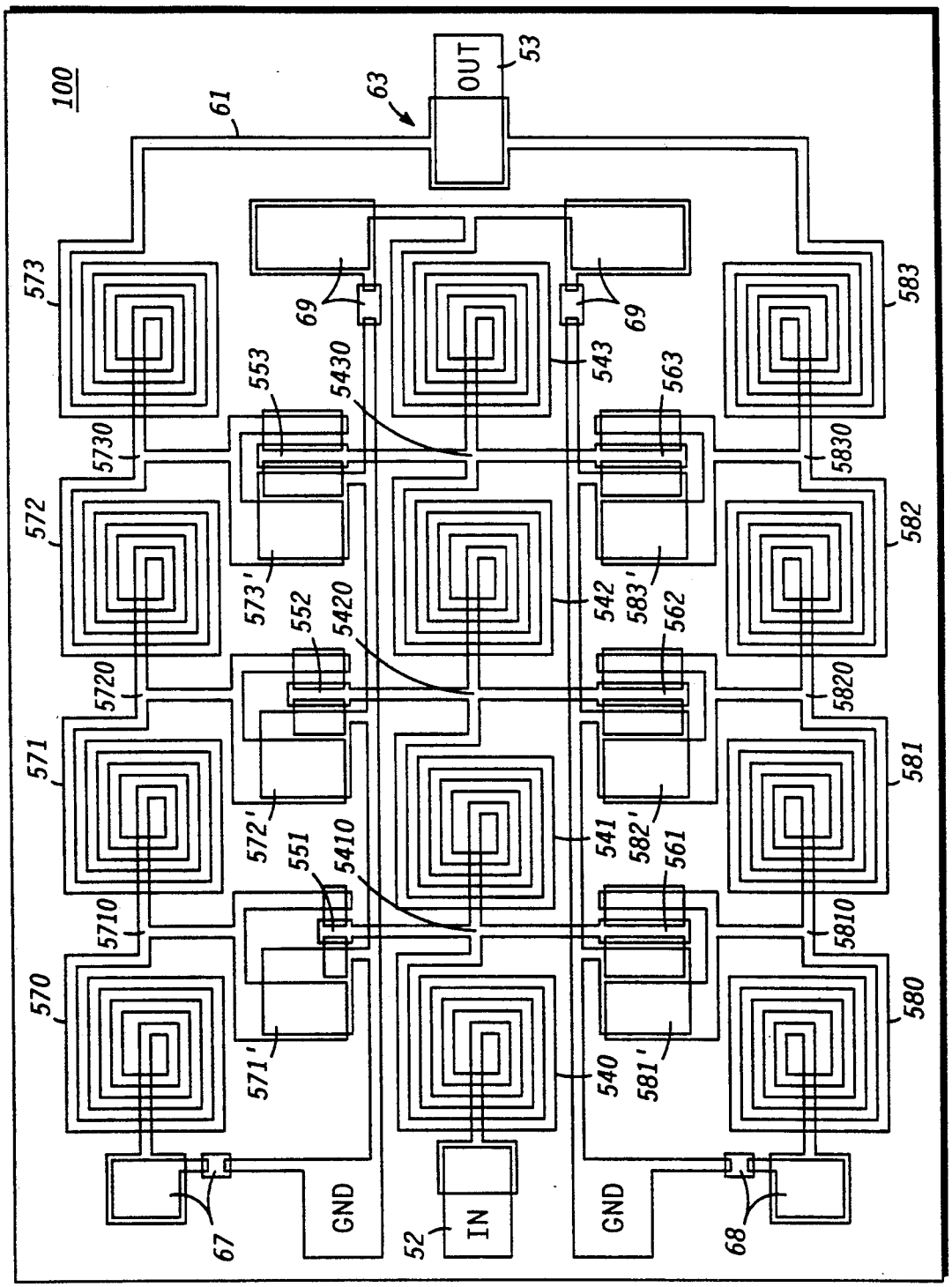
FIG. 7 is a simplified plan view of the AC portion of an amplifier stage according to the present invention, implemented as a Monolithic Microwave Integrated Circuit (MMIC).

FIG. 7 is a simplified plan view of a the AC portion GaAs MMIC implementation of an amplifier stage such as is shown in FIG. 3. Bias and internal test pads and the like and DC paths have been omitted for clarity. The same reference numbers are used on FIG. 7 to identify the various physical elements corresponding to the electrical elements shown in FIG. 3, keeping in mind that parasitic input/output capacitances of the MESFETs and other parasitics are not identified in FIG. 7. Further, for simplicity of representation, in FIG. 7 the differences in area of the spiral inductors providing the inductances depicted in FIG. 3 are ignored (they are all shown as having the same physical size). Those of skill in the art will understand that difference inductance values require different size inductors.

Based on the foregoing description, it will be apparent to those of skill in the art that the present invention solves the problems and achieves the purposes set forth earlier, and has substantial advantages as pointed out herein, namely, that it provides true logarithmic amplification in a manner and arrangement that requires no adjustable elements or off-chip components associated with the signal path (power supply and filter elements of course may be required), that the amplifier stages are readily implemented in MMIC form, that the amplifier stages have small size and light weight and are economical to manufacture using known MMIC fabrication techniques, and that the amplifier stages require no internal tuning or adjustment elements and are readily cascaded.

A further advantage of the logarithmic amplifier stage and multistage logarithmic amplifiers formed therefrom of the present invention is that input signal phase information is preserved in the output. This is very important in many applications. Also, being able to readily cascade substantially identical amplifier stages is a significant advantage. Further, the small size and low power requirement of the individual stages being cascaded provides a wide dynamic range logarithmic amplifier of extremely compact size and efficient operation.

While the present invention has been described in terms of particular materials, structures, arrangements and steps, these choices are for convenience of explanation and not intended to be limiting and, as those of skill in the art will understand based on the description herein, the present invention applies to other choices of materials, arrangements and process steps, and it is intended to include in the claims that follow, these and other variations as will occur to those of skill in the art based on the present disclosure.

We claim:

1. An amplifier for receiving an input signal and providing a logarithmically amplified output signal, comprising:
   multiple amplifying elements;
   an input transmission line or receiving the input signal;
   first and second output transmission lines each having an output; and
   a combiner having an output whence the logarithmically amplified output signal is obtained, and having a first input coupled to the output of the first output transmission line and a second input coupled to the output of the second output transmission line;
   wherein the input transmission line is coupled to the first and second output transmission lines by the multiple amplifying elements spaced apart along the transmission lines; and
   wherein the input transmission line and the first output transmission line and the amplifying elements coupled therebetween comprise a low gain high compression signal transfer path and the input transmission line and the second output transmission line and the amplifying elements coupled therebetween comprise a high gain low compression signal transfer path.

2. The amplifier of claim 1 wherein, the input transmission line comprises multiple series connected inductive impedances with input capacitances of the distributed multiple amplifying elements coupled between the inductive impedances and a reference potential, and the output transmission lines comprise multiple series connected inductive impedances with output capacitances of the distributed multiple amplifying elements coupled between the inductive impedances and the reference potential.

3. The amplifier of claim 1 wherein the low gain high compression signal transfer path comprises transistors having varying transconductance and the high gain low compression signal transfer path comprises transistors having substantially equal transconductance.

4. The amplifier of claim 1 wherein the amplifying elements comprise field effect transistors.

5. The amplifier of claim 1 wherein the amplifying elements comprise MESFETs.

6. The amplifier of claim 4 wherein channel widths of the spaced apart multiple field effect transistors coupled between the input transmission line and the first output transmission line increase in magnitude along the input transmission line.

7. The amplifier of claim 6 wherein channel widths of the multiple spaced apart field effect transistors coupled between the input transmission line and the second output transmission line have substantially constant magnitude.

8. The amplifier of claim 5 wherein channel widths of the multiple spaced apart MESFETs coupled between the input transmission line and the first output transmission line increase in magnitude along the input transmission line, and channel widths of the multiple spaced apart MESFETs coupled between the input transmission line and the second output transmission line have substantially constant magnitude.

9. The amplifier of claim 1 comprising at least first, second and third spaced apart amplifying elements coupled between the input transmission line and the first output transmission line, and at least fourth, fifth and sixth spaced apart amplifying elements coupled between the input transmission line and the second output transmission line, and wherein the first and fourth amplifying elements are coupled to a first common location on the input transmission line and the second and fifth amplifying elements are coupled to a second common location on the input transmission line spaced apart from the first common location and the third and sixth amplifying elements are coupled to a third common location on the input transmission line spaced apart from the first and second common locations.

10. A logarithmic amplifier having at least one stage comprising:
   a substrate having a principal surface with first and second opposed ends and first and second sides extending between the ends;
   a first transmission line extending at least part way between the ends with an input located in proximity to the first end, wherein the first transmission line is located approximately centrally between the sides and has multiple nodes spaced apart there along:

second and third transmission line extending at least part way between the ends having combined outputs located in proximity to the second end, wherein the second transmission line is located in proximity to a first side and the third transmission line is located in proximity to the second side and wherein the second and third transmission lines have multiple nodes spaced apart there along;

amplifier elements spaced apart longitudinally along the substrate between the ends and coupled transversely between the first transmission line and the second transmission lien and between the first transmission line and the third transmission line, each element of a first portion of the amplifier elements being coupled between a node of the first transmission line and a node of the second transfusion line, and each element of a second potion of the amplifier elements being coupled between a node of the first transmission line and anode of the third transmission line, and wherein transconductances of some of the first and second portions of the amplifier elements are not substantially the same.

11. The amplifier of claim 10 wherein N amplifier elements N1, N2, ... N are located between the first and second transmission lines and M amplifier elements M1, M2, ... M are located between the first and third transmission lines, and the amplifier elements N1, N2 ... N have different transconductances.

12. The amplifier of claim 11 wherein the amplifier elements M1, M2, ... M have substantially the same transconductances.

13. The amplifier of claim 11 wherein the transconductances of the N1, N2, ... N amplifying elements increase monotonically.

14. The amplifier of claim 10 wherein the substrate comprises a semiconductor substrate in or on which the amplifier elements are formed.

15. The amplifier of claim 10 wherein the first transmission line comprises multiple spiral inductors between several sequentially arranged nodes, and wherein inputs of the amplifying elements are coupled to the nodes and the impedance of the first transmission line is substantially determined by the combination of the spiral inductors and parasitic input capacitance of the amplifying elements coupled to the nodes.

16. A monolithic logarithmic amplifier comprising:

a semiconductor substrate having opposed ends and opposed sides extending between the ends a first transmission line means on the substrate and having an input for receiving a signal to be logarithmically amplified and comprising lumped elements having N nodes spaced apart along a first line extending part way between the ends of the substrate, wherein the first line divides the substrate into two portions, a first portion lying on a first side of the first line and a second portion lying on a second side of the first line;

a second transmission line means on the substrate and having an output and comprising lumped elements with N nodes spaced apart along a second line extending part way between the ends of the substrate, wherein the second line is located on the first portion of the substrate;

a third transmission line means on the substrate and having an output and comprising lumped elements with N nodes spaced apart along a third line extending part way between the ends of the substrate, wherein the third line is located on the second portion of the substrate;

N amplifying elements coupled between nodes of the first and second transmission lines, a first of the N amplifying elements being coupled between a first node of the first transmission line and a first node of the second transmission line, a second of the N amplifying elements being coupled between a second node of the first transmission line and a second node of the second transmission line, and the Nth of the N amplifying element being coupled between the Nth node of the first transmission line and the Nth node of the second transmission line;

N other amplifying elements coupled between nodes of the first and third transmission lines, a first of the N other amplifying elements being coupled between a first node of the first transmission line and a first node of the third transmission line, a second of the N other amplifying elements being coupled between a second node of the first transmission line and a second node of the third transmission line, and the Nth of the N other amplifying element being coupled between the Nth node of the first transmission line and the Nth node of the third transmission line;

combiner means having an output from whence a logarithmic output signal is obtained and having a first input coupled to the output of the second transmission line and a second input coupled to the output of the third transmission line; and wherein at least some of the N amplifying elements coupled to nodes of the first transmission line have different gains and compressions than the corresponding other amplifying elements coupled to the same nodes of the first transmission line.

17. A method for logarithmically amplifying signals comprising:

providing an input signal to an input transmission line having nodes sequentially distributed there along;

coupling a portion of the input signal appearing at sequential nodes of the input transmission line to input of first and second sets of multiple amplifying elements to be amplified and appear at outputs of the multiple amplifying elements wherein signal appearing at outputs of the first set of multiple amplifying elements are coupled to spaced apart nodes of a first output transmission line and signals appearing at outputs of the second set of multiple amplifying elements are coupled to spaced apart nodes of a second output transmission line, so that signals passing through the input transmission line, the first set of multiple amplifying elements and the first output transmission lien experience low gain and high compression and so that signals passing through the input transmission line, the second set of multiple amplifying elements and the second output transmission line experience high gain and low compression;

coupling signals appearing at the output of the first transmission line to a first input of a combiner, wherein the combiner has an output port and coupling signals appearing at the output of the second transmission line to a second input of the combiner; and extracting the logarithmically amplified signal at the combiner output port.

* * * * *

UNITED STATES PATENT AND TRADEMARK OFFICE
CERTIFICATE OF CORRECTION

PATENT NO. : 5,177,381

DATED : January 5, 1993

INVENTOR(S) : Michael J. Friesen et al

It is certified that error appears in the above-identified patent and that said Letters Patent is hereby corrected as shown below:

Column 9, line 14, claim 10, change "lien" to --line--.

Column 9, line 18, claim 10, change "transfusion" to --transmission--.

Column 9, line 20, claim 10, change "anode" to --a node--.

Column 10, line 43, claim 17, change "input" to --inputs--.

Column 10, line 45, claim 17, change "signal" to --signals--.

Column 10, line 54, claim 17, change "lien" to --line--.

Signed and Sealed this

Twenty-first Day of December, 1993

Attest:

BRUCE LEHMAN

Attesting Officer    Commissioner of Patents and Trademarks